(12) United States Patent
Brennan et al.

(10) Patent No.: US 10,678,961 B1
(45) Date of Patent: Jun. 9, 2020

(54) CONTEXT SENSITIVE SIMULATION ENVIRONMENT

(75) Inventors: Douglas Brennan, Newport Beach, CA (US); Kunaseelan Kanthasamy, Irvine, CA (US); Herbert Hunt, San Francisco, CA (US)

(73) Assignee: MSC.Software Corporation, Newport Beach, CA (US)

( * ) Notice: Subject to any disclaimer, the term of this patent is extended or adjusted under 35 U.S.C. 154(b) by 1139 days.

(21) Appl. No.: 13/339,335

(22) Filed: Dec. 28, 2011

(51) Int. Cl.
*G06F 30/12* (2020.01)
(52) U.S. Cl.
CPC .................................. *G06F 30/12* (2020.01)
(58) Field of Classification Search
None
See application file for complete search history.

(56) References Cited

U.S. PATENT DOCUMENTS

| | | | | |
|---|---|---|---|---|
| 5,815,154 A * | 9/1998 | Hirschtick | ............... | G06F 17/50 345/420 |
| 6,888,542 B1 * | 5/2005 | Clauss | .................... | G06F 17/50 345/420 |
| 7,660,710 B2 * | 2/2010 | Sirrine | ............................. | 703/8 |
| 2007/0239406 A9 * | 10/2007 | Chin | ....................... | G06F 17/50 703/2 |
| 2008/0010041 A1 * | 1/2008 | McDaniel | ......................... | 703/1 |
| 2008/0312880 A1 * | 12/2008 | McLuckie | .............. | G05B 17/02 703/1 |
| 2009/0306955 A1 * | 12/2009 | Begin et al. | .................... | 703/22 |

OTHER PUBLICATIONS

Ryu, "Integration of Heterogeneous Simulation Models for Network-Distributed Simulation", PHD dissertation, The University of Michigan, 2009, 186 pages.*

* cited by examiner

*Primary Examiner* — Bijan Mapar
(74) *Attorney, Agent, or Firm* — Foley & Lardner LLP

(57) ABSTRACT

A method, apparatus and computer readable medium for performing a computer simulation to predict the behavior or response of a physical object includes receiving at least one selection made by a user with respect to a context of the computer simulation to be performed. Based on the at least one selection, a list of tools, objects and properties is filtered to be displayed to the user with respect to the computer simulation to be performed, to display only those tools, object and properties that are pertinent to the context of the computer simulation to be performed. The filtered listed of tools, objects and properties with respect to the computer simulation is displayed, to obtain user input of which of the tools, objects and properties are to be utilized in the computer simulation.

13 Claims, 6 Drawing Sheets

CONTEXT SENSITIVE SIMULATION ENVIRONMENT

BACKGROUND

1. Field of the Disclosure

This disclosure relates generally to apparatus and methods for simulations of mechanical objects.

2. Related Art

Predicting behavior of mechanical objects is important in order to predict the behavior or response of those objects, and to assess the operability of those objects over time. Typically, the predicted behavior is performed by way of computer simulations of the mechanical objects.

One such way of predicting behavior of mechanical objects is by using a finite element method, which is used to predict the behavior of one or more physical objects in a virtual environment. The finite element method involves five basic steps:

1. Creation of the finite element model, typically, but not always from geometry design imported from computer-aided design (CAD) systems.
2. Enhancement of the finite element model with material, property, load and constraint attributes.
3. Transformation of the attributed model into a formatted file suitable for consumption by a finite element solver.
4. Transformation of the information contained within the formatted solver files into a set of equations and subsequent solution of these equations by the finite element solver.
5. Post-processing of the results from the solution of the equations.

Many different types of simulation technologies or techniques can be applied to predict the behavior of mechanical objects, with each of the different simulation technologies or techniques being designed to extract relevant response data. In general, multiple simulation techniques are required to establish the behavior of a product design under all of the operating conditions that it is intended to operate.

Current simulation environments offer users large sets of tools to help carry out the different types of simulation required to gain confidence in a product design. As simulation technologies have matured, these environments have struggled to manage the increased number of tools required to support even individual simulation technologies, as well as the tools required to support multiple simulation technologies. As a result, simulation applications have become ever more complex and difficult to use.

Individual users tend to use only a very small number of the total number of available tools and options provided by current simulation systems because individual users typically require to use a specific simulation approach but most simulation systems are general purpose in nature.

As such, it is desirable to come up with a way to make simulation systems less complex and easier for a user to work with, especially with respect to the number of tools that are capable of being used for operation of these simulation systems.

SUMMARY OF THE DISCLOSURE

Various embodiments are directed to making simulation systems less complex and easier for a user to work with, especially with respect to the number of tools that are capable of being used for operation of these simulation systems.

In various other embodiments, a method for performing a computer simulation to predict the behavior or response of a physical object includes receiving at least one selection made by a user with respect to a context of the computer simulation to be performed. The method also includes, based on the at least one selection, filtering a list of tools, objects and properties to be displayed to the user with respect to the computer simulation to be performed, to display only those tools, object and properties that are pertinent to the context of the computer simulation to be performed. The method further includes displaying the filtered listed of tools, objects and properties with respect to the computer simulation, to obtain user input of which of the tools, objects and properties are to be utilized in the computer simulation.

In various other embodiments, a non-transitory computer readable medium that stores computer program product which, when executed by a computer, causes the computer to perform the functions of: receiving at least one selection made by a user with respect to a context of the computer simulation to be performed; based on the at least one selection, filtering a list of tools, objects and properties to be displayed to the user with respect to the computer simulation to be performed, to display only those tools, object and properties that are pertinent to the context of the computer simulation to be performed; and displaying the filtered listed of tools, objects and properties with respect to the computer simulation, to obtain user input of which of the tools, objects and properties are to be utilized in the computer simulation.

In various other embodiments, an apparatus for modeling a physical object includes a receiving unit configured to receive user input with respect to modeling context and simulation context, or model context ON or OFF. The apparatus further includes a simulation unit configured to perform a simulation of the physical object based on the user input and based on data of the physical object obtained from a database. The apparatus further includes an output unit configured to output results of the simulation as provided by the simulation unit.

DETAILED DESCRIPTION

Figure 1:
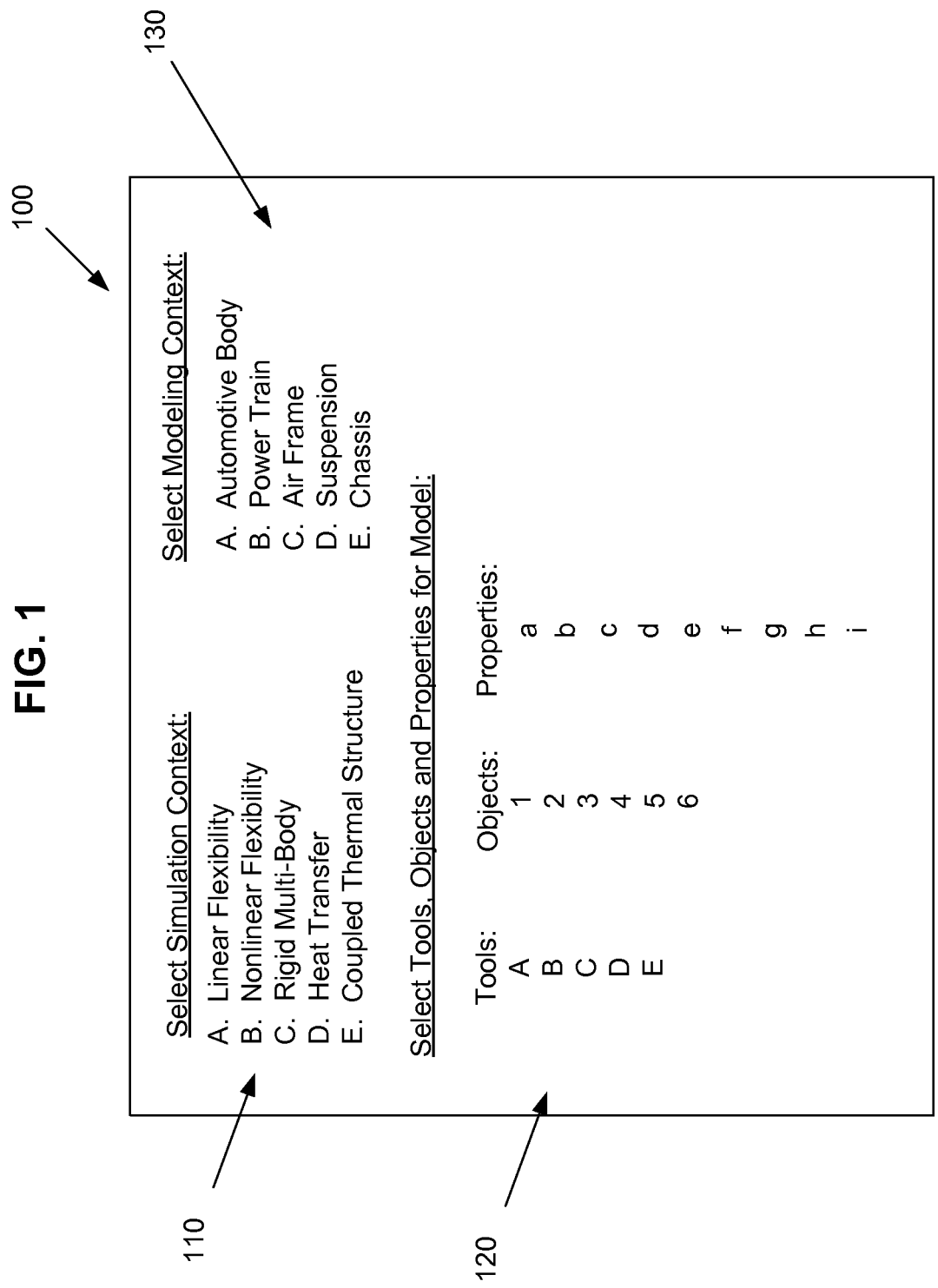
FIG. 1 shows a graphical user interface that is used to receive user input according to the first embodiment.

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Various embodiments of a context sensitive simulation environment apparatus and method for use in modeling behavior of one or more physical objects are described hereinbelow.

A first embodiment of the invention as described in detail below enables developers of general purpose applications to provide user environments that are specific to the users needs. This is achieved by adapting the environment to both the goals of the user and to the contents of the model that he/she is simulating. The present invention according to the first embodiment can be implemented as a software system and can be realized through implementation of a set of behaviors within a simulation product. The following paragraphs describe the first embodiment by describing how it responds to a user's actions.

According to the first embodiment, when a user starts a new simulation session, that user is provided the opportunity to define the simulation context. Some examples of simulation context include "Linear Flexibility", Nonlinear Flexibility", "Rigid Multi-Body", "Heat transfer", "Coupled Thermal Structural".

Each of the simulation contexts that can be selected by the user is associated with a set of Tools, Objects and Properties (or Attributes) that are supported by the simulation application. In more detail, each of these sets of contexts is associated with a subset of the total number of Tools, Objects and Properties that the application supports.

Although a simulation application can be delivered with a number of these simulation context definitions predefined, user, divisions and companies can also extend, modify or add to these simulation context definitions, as needed or as suits the needs of the user, division or company.

After the user selects a simulation context for a simulation that he/she desires to run, the application will subsequently filter the display of the Tools, Objects and Properties such that only the ones that are relevant to the currently selected simulation context are displayed within the application, thereby reducing the application complexity.

For example, if the user selects the simulation context "Linear flexibility", the application will not display any tools, objects or attributes related to nonlinear materials, contact, large deformations, heat transfer or multi-body simulations, since those tools, objects or attributes are not pertinent to a linear flexibility simulation context.

Figure 2:
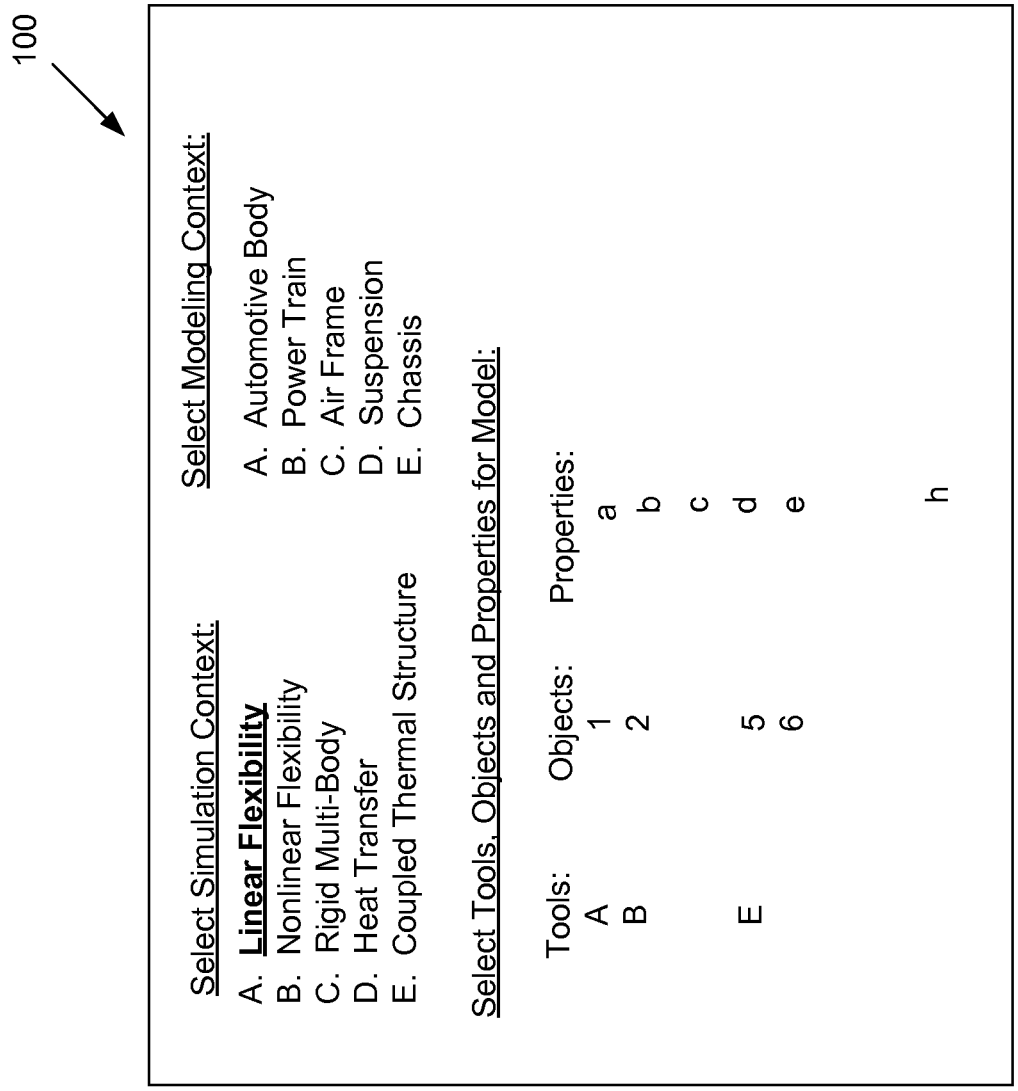
FIG. 2 shows the graphical user interface after the user has made a simulation context selection, according to the first embodiment.

Referring now to FIG. 1, which shows a graphical user interface (GUI) screen 100 that a user may see when starting a simulation, the user first selects the simulation context from a list of possible simulation contexts. Once the user has selected a particular simulation context in region 110, such as "Linear flexibility", the GUI screen 100 will hide the tools, objects and properties of the simulation application that are not pertinent to a linear flexibility simulation. Referring now to FIG. 2, tools C, D, objects 3, 4, and properties f, g, i are no longer shown in the list 120 of tools, objects and properties that can be selected by the user in the GUI screen 100.

Figure 3:
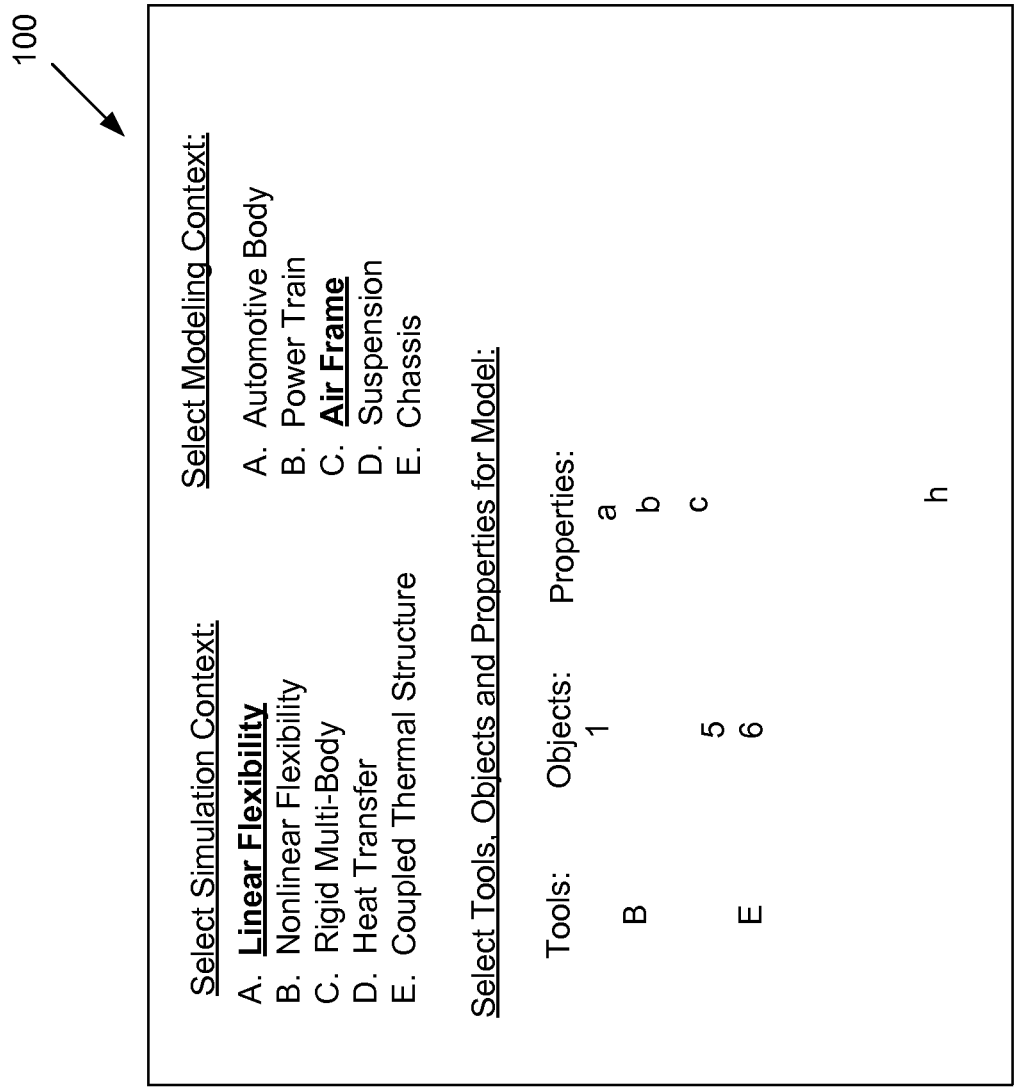
FIG. 3 shows the graphical user interface after the user has made a simulation context selection and a modeling context selection, according to the first embodiment.

Once the simulation context has been selected by the user, in the first embodiment the user can then select a modeling context from amongst a plurality of possible modeling contexts. By way of example, and referring again to FIG. 1, the user may choose a modeling context from the following modeling contexts provided in region 130: a) automotive body, b) power train, c) air frame, d) suspension, and e) chassis, whereby these modeling contexts are applicable to a simulation that simulates operation of an aircraft or car. Other choices of modeling contexts may be utilized, based on the object to be simulated, while remaining within the spirit and scope of the invention. Once a modeling context has been selected, such as "air frame", the list 120 of tools, objects and properties is further limited to those that are pertinent to the selected simulation context and modeling context. Referring now to FIGS. 2 and 3, the selection of the modeling context "air frame" removes tool A, object 2, and properties d, e from the list of tools, objects and properties that can be selected by the user for this simulation.

In the first embodiment, each of the modeling contexts is associated not only with a subset of Tools, Objects and Properties that are supported by the application, but one can also define default settings for those items. For example, in a 'setup' phase of the simulation application, the user can select default tools, objects and properties that will be displayed for selection by the user when the user selects a particular modeling context. In other implementations, only users with sufficient rights can select default values for the tools, objects and properties that are associated with each of the tools, objects and properties that can be selected by a user when running a simulation of a physical object.

After user selection of a modeling context, in the first embodiment the application filters the display of the Tools, Objects and Properties such that only the ones that are relevant to the user-selected Simulation Context and the user-selected Modeling Context are displayed for selection by the user for running a particular simulation. Additionally, the application updates the application default values with the relevant modeling context default values, thereby ensuring that the user will not have to change these values when using the application. Of course, the user has the option to change one or more of the default values to suit a particular simulation environment, if so desired.

For example, if a user selects the modeling context "Automotive Body", the application can modify the "Meshing" tool to change the default mesh size to 8 mm, change the default surface meshing algorithm from "All Quad" to "Quad Dominant", and hide the "Bolted Connection" tool completely, since those tools are not especially pertinent to an automotive body simulation.

An example is discussed in detail herein with respect to a representative set of objects, tools and properties that are associated with a simulation application that may be filtered based on either simulation context or contents of a model to be simulated, in accordance with various embodiments of the invention.

A Material object is used to define the material properties of any materials that are used in the simulation. Examples of materials include Steel, Plastic, Wood, Aluminum, Titanium etc.

Materials can have many different properties that represent different behaviors of the material. For example a material may have an Elastic Modulus that is a measure how much the material will strain (stretch) under load. Some materials exhibit a behavior where the modulus is linear over some range of loads and the modulus can be define using a single number. In some cases, the relationship between stress and strain is nonlinear, and a curve is utilized to represent the relationship between stress and strain. An associated stiffness property is the Poisson ratio that determines how much a material will strain in different direction when loaded in one direction. For example, as a rubber band is stretched along its length, it stretches (gets longer) in the axial direction but it also gets narrower in cross section. Different Materials also may have different densities, which affects how much a given volume of material will weigh.

Other properties are related to the environment that the material is exposed to. For example, when a Material is subjected to heat, it will usually expand or contract. The amount of expansion or contraction is defined using the Thermal Expansion Coefficient. This value may be a single value or it may be a curve. When a Material is subjected to heat, it will usually transmit that heat from the hotter region to the cooler region. The material property that determines how quickly the heat transfer takes place is known as the thermal conductivity, which can be a single scalar value (linear) or it can be represented by a curve (temperature dependent). Many more properties exist for materials, however the above examples provide a reasonable indication of the general pattern of different properties that can be selected for a simulation of a material.

The application according to some embodiments can provide a "Material Definition Tool" to enable the user to define the material object properties. In order to fully define a Material, all of the values for all of the properties are required, and this can lead to a substantial amount of data entry and complexity for the user. If a user has elected to perform a "Linear Flexibility" simulation according to some embodiments, he/she only needs to define the Elastic Modulus and the Poisson ratio properties for the Material, since none of the other material properties are relevant to this type of simulation. This is determined by a rule provided by the system that relates required material properties to Simulation Type. The Adaptive Simulation Environment modifies the Material Definition Tool in such a way that it only requires the input of the Elastic Modulus and the Poisson Ratio, whereby the other properties of a material that are not pertinent to the "Linear Flexibility" simulation are not provided to the user for possible selection in a simulation to be performed.

If a user has instead elected to perform a "Linear Modes" simulation, the system requires the Elastic Modulus, the Poisson ratio, and the material Density properties. In this case, the Adaptive Simulation Environment modifies the Material Definition Tool in such a way that it only requires the user to define the required material properties of Elastic Modulus, Poisson ratio, and material Density, whereby the other properties of a material that are not pertinent to the "Linear Modes" simulation are not provided to the user for possible selection in a simulation to be performed.

The above two rules are examples of how the Adaptive Simulation Environment works to adapt properties based on Simulation Context, in accordance with various embodiments of the invention.

The example will now be directed to the filtering of objects. Load objects are used to define how the environment acts upon the model that is being simulated. Some examples of loads are Pressure, Forces, Accelerations, Heat flux, Boundary temperatures etc. For example, when a user is simulating an aircraft flying at a given altitude, the internal pressure inside the fuselage is required to correctly simulate the behavior of the structure.

Loads can be represented by constant values. For example, if an aircraft is being simulated in steady flight at a constant altitude, the cabin pressure is constant with respect to the atmospheric pressure outside the cabin.

Loads may also vary with respect to some other variable such as time or frequency. For example, if an aircraft flight is being simulated from take-off until it reaches cruising altitude, the relative internal pressure will be zero at ground level and will gradually increase as the aircraft gains altitude over time.

A simulation application provides Tools for the user to define each type of load, such as Pressure, Force, Heat flux, etc., and these tools provide capabilities for defining constant load values and varying load values (time dependent, frequency dependent etc.). It is much more complex from a computational perspective to define varying loads than constant loads.

If a user is carrying out a Static simulation, then the system only requires the constant load data. Any data related to time or frequency dependency is not required for the Static simulation, and is not provided for this type of simulation. This relationship between Simulation Context and required Load attributes is defined using a Rule provided by the system in accordance with various embodiments of the invention. Based on that rule, the Adaptive Simulation Environment modifies all load tools so that the user is only required to enter the constant load data, thereby reducing the complexity of the user interface for running the Static simulation.

If instead a user is carrying out a Transient simulation, then the system may require the time dependent data associated with the load, and in this case the Adaptive Simulation Environment modifies the Tool so that it requires the user to provide only the required data for running the Transient simulation.

Both of the above examples show how the Adaptive Simulation Environment according to various embodiments modifies application tools based on the Simulation Context by filtering the required tool input to only provide those applicable to the particular type of simulation to be run.

In some cases, an entire tool may not be required based on Simulation Context. For example, if the user has indicated that he/she wants to carry out a Linear Static simulation, there is no purpose in defining a Heat Flux Load object, because heat flux cannot be accounted for in a linear static analysis. In this case, the Adaptive Simulation Environment according to various embodiments hides the "Heat Flux" tool from the user completely (and thus cannot be selected by the user), thereby reducing the number of Tools (and resultant objects) that a user has to choose from to only those tools that are relevant to the Simulation Context.

With respect to Meshing Tools, simulation environments that support finite element based simulation methods generally provide multiple tools to enable the user to create finite element meshes. Typically there will be meshing tools used to create 1D mesh (from geometry curves), 2D meshes from geometry surfaces and faces, and 3D meshes from geometry solids.

If a model contains no 3D solid geometry bodies, the 3D mesh tools cannot be used since they require a 3D geometry body as input. Thus, those Tools are not provided to the user when the user is setting up a simulation for that model.

When the user is working on a Model that contains no 3D solid geometry, the Adaptive Simulation Environment according to various embodiments hides the 3D mesh tool and only displays the mesh tools (e.g., 1D, 2D) that make sense for that Model. The Adaptive Simulation Environment may do this based on a rule that is implemented by the system relating Tool applicability to Model Content.

The same pattern of tool applicability also applies to the 2D meshing tool and the existence of geometry surfaces/faces and the 1D meshing tool and the existence of geometry curves/edges.

As another example of the user of mesh objects, if a user has selected a Simulation Context that involves only rigid multi-body simulation, then no mesh objects are required by the simulation and any mesh objects that exist in the model will be ignored. In this case, the Adaptive Simulation Environment according to various embodiments hides all mesh tools (and resultant mesh objects) from the user, since they are not applicable to the rigid multi-body Simulation Context. The system determines which tools to hide based on a rule defined in the system that relates Tool applicability to Simulation Context. This information can be input to the system prior to running any simulations, and can be based on user-inputted information as to which tools are applicable to which types of simulations that can be run.

If a user has selected a "Powertrain" Simulation context, that context includes some simulation context specific default values related to meshing. For example, this context may have defined: a) the default meshing tool to be the "3D Tetrahedral Mesh" tool, b) the default Tetrahedral Mesh size to be 8 mm, c) the default tetrahedral element type to be a linear tetrahedral, and d) Feature based meshing for 3D Holes to be enabled. Although the system may support a set of factory defaults for all of these parameters, the Simulation Context can define an alternate set of defaults, specific for that Simulation Context, in accordance with various embodiments of the invention. The user can enter his/her own alternate set of default values into the system or select from predefined default values.

The Adaptive Simulation Environment according to various embodiments causes the application to display the default values specific to the Simulation Context that the user has selected. In this case, when the user invokes the 3D mesh tool, it will, by default, be configured to use: Tetrahedral elements (Not Hexahedral), Default mesh size to be 8 mm, and Linear tetrahedral elements (not quadratic or higher order), and Feature meshes for 3D Holes (instead of topology based meshing).

The above example shows how the Adaptive Simulation Environment according to various embodiments can modify the default values of any tool in the system to be different from the factory defaults provided for a tool, and cause these modified default values to be used in place of the factory defaults when the user selects a specific Simulation Context.

In a second embodiment, a model context can also be specified by a user to be either ON or OFF, in which the model context is a behavior provided by the application that also controls the display of Tools, Objects and Attributes (or Properties) in the same way as the simulation context and the modeling context, but whereby it does not select a predefined, or user defined context. Instead, model context impacts behavior of the application by monitoring the content of the model that the user is working on. By use of the model context, any Tool, Object or Attribute that requires the existence of a particular object in the model to be viable, will be displayed only if at least one of that object type exists. In that regard, the second embodiment provides for an automatic selection of tools, objects and attributes that is not based on user selection of tools, objects and attributes from a list of all possible tools, objects and attributes, in which the automatic selection is based on processing the physical object and environment data input to the simulation to determine which of the tools, objects and attributes of the application can be used to operate on the physical object and environment data.

For example, the application may contain a tool that is used to split a geometry surface or face. This tool requires the existence of a surface or face to have any meaningful purpose, and therefore if the model does not contain one or more faces or surfaces, this tool will not be displayed if the user had selected model context ON. As soon as a surface or a face becomes available within the model, the application will cause this tool to be displayed for possible selection by the user.

Figure 4:
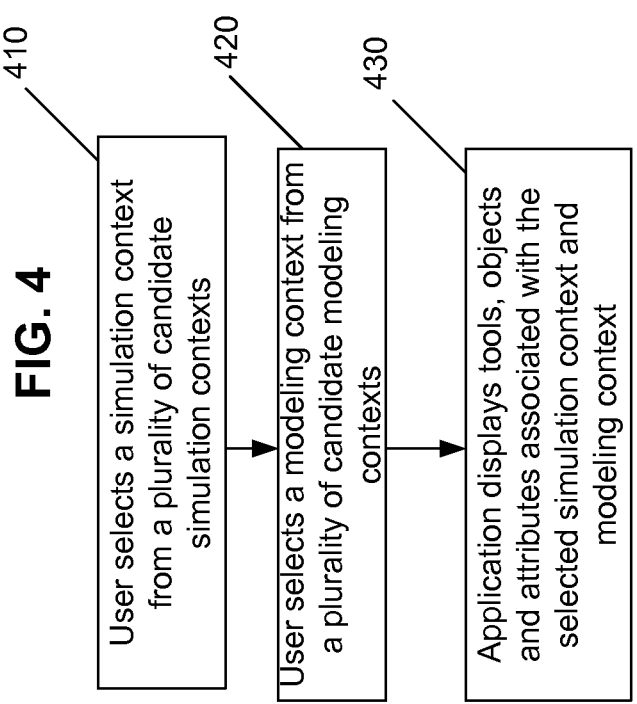
FIG. 4 shows steps in a method for performing a simulation, according to the first embodiment.

FIG. 4 is a flow chart showing a method consistent with the first embodiment. In step 410, a user selects a simulation context from amongst a plurality of candidate simulation contexts. In step 420, the user selects a modeling context from amongst a plurality of candidate modeling contexts. In step 430, the application displays only the tools, objects and attributes that are pertinent to the user-selected simulation context and modeling context.

Figure 5:
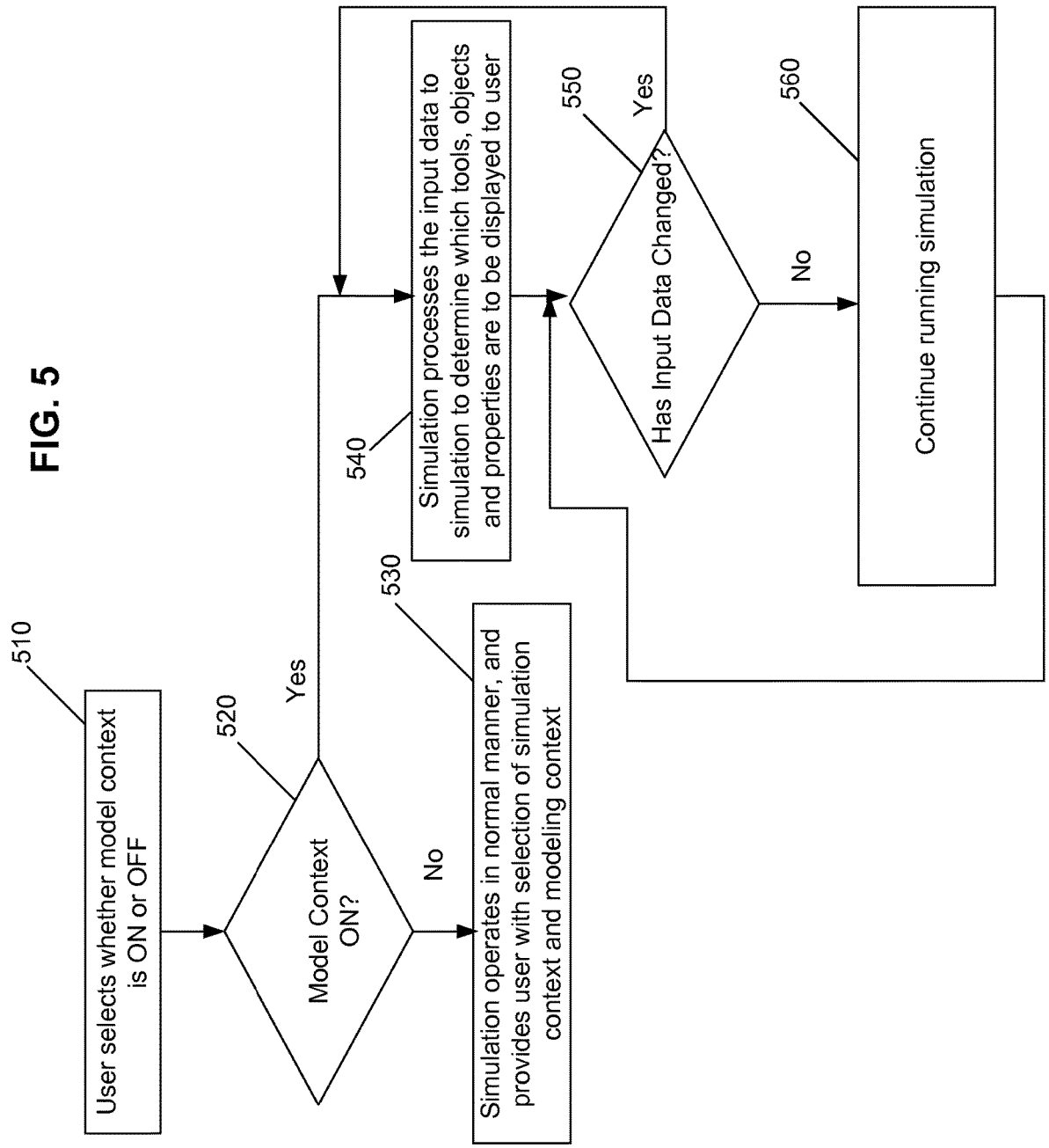
FIG. 5 shows steps in a method for performing a simulation, according to a second embodiment.

FIG. 5 is a flow chart showing a method consistent with the second embodiment. In step 510, a user selects whether model context is ON or OFF. If the model context selection is OFF as determined in step 520, then in step 530 the simulation operates in a normal manner, and may provide the user with selection of a simulation context and a modeling context as shown in FIG. 1. If the model context selection is ON, then in step 540 the simulation processes the input data to the simulation to determine which of the set of tools, objects and attributes of the simulation application are to be displayed to a user for selection in the simulation, based on a priori knowledge of which of those tools, object and attributes are capable of operating on the particular type of input data that has been processed. In step 550, it is determined whether the input data has changed, and if so, step 540 is rerun to modify the list of tools, objects and attributes that are to be displayed to the user for use by the simulation application. If it is determined in step 550 that the input data has not changed, then the simulation is continued running with the same set of parameters as before in step 560, whereby the process loops back prior to step 550 to continue to check if the input data has changed.

Figure 6:
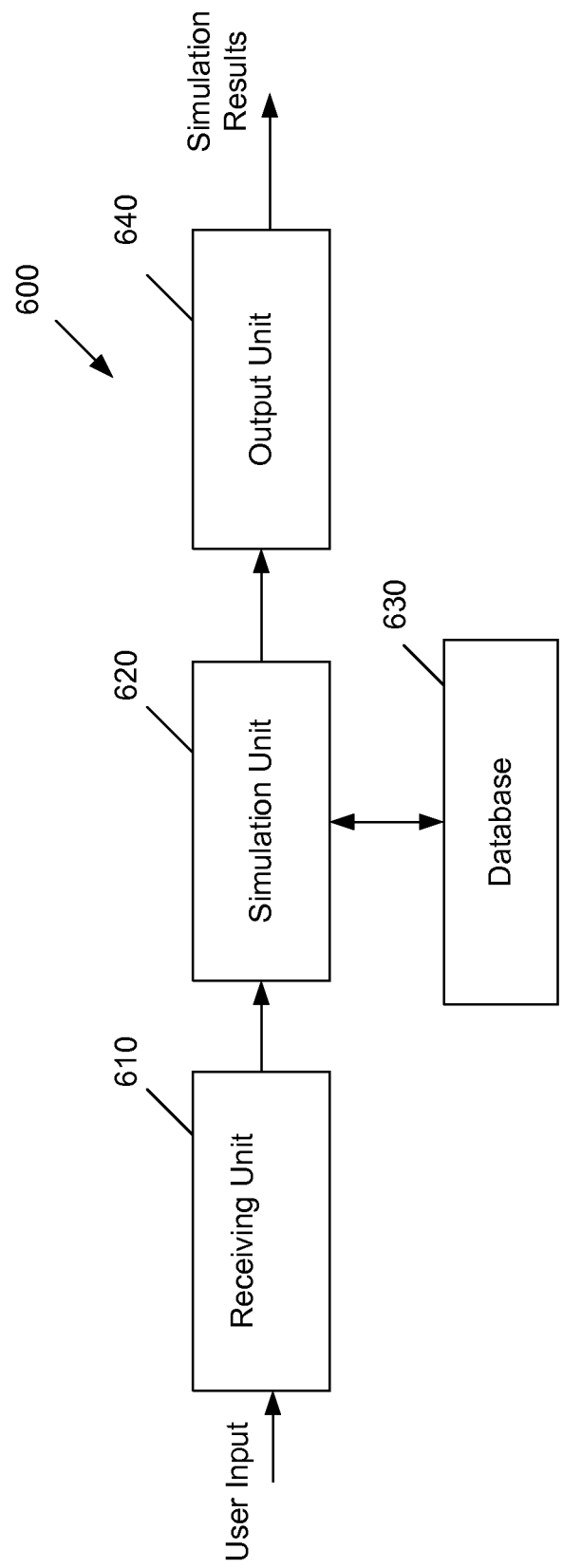
FIG. 6 shows an apparatus that can be used to implement the first or the second embodiment.

FIG. 6 shows an apparatus 600 that can be used to implement the first embodiment. A receiving unit 610 receives user input with respect to modeling context and simulation context (first embodiment), or model context ON or OFF (second embodiment). A simulation unit 620 performs a simulation of the physical object based on the user input and based on data of the physical object obtained from a database 630. An output unit 640 outputs results of the simulation as provided by the simulation unit 620, such as on a display of a user's computer.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-Ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method of performing a computer simulation using a computer to predict a behavior or response of a physical object, comprising:

displaying a list of tools, objects, and properties;

monitoring a content of a model of the physical object and determining that the model excludes a geometric feature type;

receiving at least one selection made by a user with respect to use of an automatic model context for the computer simulation to be performed, wherein the automatic model context being ON causes automatically filtering the list of tools, objects, and properties based on the model excluding the geometric feature type instead of filtering the list of tools, objects, and properties based on user input corresponding to simulation context;

determining that the automatic model context is ON based on the at least one selection;

in response to determining that the automatic model context is ON, filtering the list of tools, objects, and properties by determining that a first set of tools, objects, and properties associated with the computer simulation is to be displayed to the user for possible selection by the user, based on the model excluding the geometric feature type, the first set of tools, objects, and properties associated with the computer simulation being a smaller group than the list of tools, objects, and properties;

displaying the first set of tools, objects and properties, for possible selection by the user when running the computer simulation; and performing the computer simulation using the first set of tools.

2. A non-transitory computer readable medium that stores computer program product which, when executed by a computer, causes the computer to perform the functions of:

displaying a list of tools, objects, and properties;

monitoring a content of a model of a physical object and determining that the model excludes a geometric feature type;

receiving at least one selection made by a user with respect to use of an automatic model context for a computer simulation to be performed, wherein the automatic model context being ON causes automatically filtering the list of tools, objects, and properties based on the model excluding the geometric feature type instead of filtering the list of tools, objects, and properties based on user input corresponding to simulation context;

determining that the automatic model context is ON based on the at least one selection;

in response to determining that the automatic model context is ON, filtering the list of tools, objects, and properties by determining that a first set of tools, objects, and properties associated with the computer simulation is to be displayed to the user for possible selection by the user, based on the model excluding the geometric feature type, the first set of tools, objects, and properties associated with the computer simulation being a smaller group than the list of tools, objects, and properties;

displaying the first set of tools, objects, and properties with respect to the computer simulation, for possible selection by the user when running the computer simulation; and performing the computer simulation using the first set of tools.

3. The method of claim 1, wherein in response to determining that the automatic model context is ON, the list of tools, objects, and properties is filtered without further user input.

4. The method of claim 1, wherein the first set of tools, objects, and properties comprises a tool that splits a geometry surface or face.

5. The method of claim 4, wherein determining that the first set of tools, objects, and properties associated with the computer simulation is to be displayed to the user for the possible selection by the user, based on the model excluding the geometric feature type comprises:

hiding the tool that splits the geometry surface or face in response to determining that the model of the physical object lacks a surface or face, wherein the surface or face is the geometric feature type.

6. The method of claim 5, further comprising:
monitoring the content of the model comprises determining that a surface or a face becomes available within the model, wherein the surface or the face has not been previously available within the model; and displaying the tool that splits the geometry surface or face in response to determining that the surface or the face becomes available within the model.

7. The method of claim 4, wherein determining that the first set of tools, objects, and properties associated with the computer simulation is to be displayed to the user for the possible selection by the user, based on the model excluding the geometric feature type comprises displaying a tool that splits the geometry surface or face in response to determining that the surface or the face is available within the model.

8. The method of claim 1, wherein the geometric feature type is a surface or a face within the model.

9. The method of claim 1, wherein determining that the first set of tools, objects, and properties associated with the computer simulation is to be displayed to the user for possible selection by the user, based on the model excluding the geometric feature type comprises determining that the first set of tools, objects, and properties is capable of operating on a particular type of input data corresponding to another geometric feature type of the model, wherein the another geometric feature type is different from the geometric feature type.

10. The method of claim 1, wherein filtering the list of tools, objects, and properties further comprises determining that a second set of tools, objects, and properties associated with the computer simulation is to be excluded from being displayed to the user, wherein the second set of tools, objects, and properties corresponds to the geometric feature type.

11. The method of claim 10, wherein the second set of tools, objects, and properties is configured to operate on the geometric feature type based on a priori knowledge.

12. The method of claim 1, wherein the content of the model is being monitored while the user is working on the model.

13. The method of claim 1, wherein the content of the model is being monitored automatically.

* * * * *